United States Patent
Eliasson

(10) Patent No.: US 7,384,193 B2
(45) Date of Patent: Jun. 10, 2008

(54) METHOD FOR RELOCATING THE RANGE OF FOCUS IN A LINE SCAN CAMERA HAVING TIME DOMAIN INTEGRATION IMAGE SENSORS

(75) Inventor: Tracy K. Eliasson, Boulder, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 50 days.

(21) Appl. No.: 11/553,534

(22) Filed: Oct. 27, 2006

(65) Prior Publication Data

US 2008/0101549 A1 May 1, 2008

(51) Int. Cl.
*G01D 18/00* (2006.01)
(52) U.S. Cl. .......................... 378/207; 378/57; 378/62
(58) Field of Classification Search .............. 378/62, 378/207, 208, 58, 22, 51, 57; 702/150; 356/444, 356/440
See application file for complete search history.

(56) References Cited

U.S. PATENT DOCUMENTS

2004/0184576 A1 * 9/2004 Meyer ..................... 378/58

FOREIGN PATENT DOCUMENTS

JP 04319610 A * 11/1992

* cited by examiner

*Primary Examiner*—Hoon Song

(57) ABSTRACT

The need for a Time Domain Integration line scan camera to change a workpiece's height in z to relocate an ROF (Range Of Focus) of fixed excursions about a fixed POLB (Plane Of Least Blur) is removed by making the location of the POLB movable, thus making the location of the associated ROF variable, while leaving the actual z height of the workpiece unchanged. This can be accomplished by ensuring that, for a desired new location of the POLB, the rate at which the physical $\Delta y$s transpire for the motion of the workpiece (which may be a PCA) matches the rate at which the optical $\Delta y$s are clocked for the TDI image sensor. That may be achieved by varying the value for physical $\Delta y$ as function of the POLB's location in z regardless of $V_{scan}$, but while also adjusting $V_{scan}$ if that is necessary or desirable to keep such things as sensor cell exposure levels, and contrast from moving away from their optimum values.

22 Claims, 3 Drawing Sheets

METHOD FOR RELOCATING THE RANGE OF FOCUS IN A LINE SCAN CAMERA HAVING TIME DOMAIN INTEGRATION IMAGE SENSORS

REFERENCE TO RELATED PATENTS

This application is related to the subject matter of U.S. patent application entitled PRECISE X-RAY INSPECTION SYSTEM UTILIZING MULTIPLE LINEAR SENSORS, Ser. No. 10/394,632 filed 21 Mar. 2003 by Gerald L. Meyer and assigned to Agilent Technologies, Inc. For brevity and the sake of completeness, PRECISE X-RAY INSPECTION SYSTEM UTILIZING MULTIPLE LINEAR SENSORS is hereby incorporated herein by reference.

INTRODUCTION AND BACKGROUND

The electronic assemblies of today, whether they be a large IC (Integrated Circuit) or a PCA (Printed Circuit Assembly) can posses an extraordinary degree of functionality. This has created issues related to initial testing and performance verification upon manufacture, as well as to periodic testing and performance verification during routine maintenance or trouble shooting and repair. In many cases, the old technique of having a test procedure followed by a trained technician that understands how the thing works is simply out of the question: the overwhelming complexity and issues of time and cost force us to seek other approaches.

In manufacturing large complex electronic assemblies the philosophy has tended toward one of ensuring that the design is sound, and then using good parts to correctly form the assembly. The expectation is that the completed assembly should work as desired. Associated with this is the notion that the sooner a defect can be discovered in the manufacturing process, the less it costs to discover and fix it. Some defects can only be discovered through performance testing, while others, especially those related to mechanical properties, can be discovered by inspection. Both performance testing and inspection can be automated to a significant degree. And since the effect on performance of a mechanical defect, such as a solder bridge between two traces on the PCA, or a break in a trace, might be pronounced ("It's dead and oozing stinky smoke . . . ") or subtle ("Every so often it does something goofy . . . "), and since finding a mechanically based electrical fault by analysis of electrical operation is like looking through the wrong end of a telescope, it is generally agreed that a through mechanical inspection should precede an attempt to operate the assembly.

Automated mechanical inspection of assembled PCAs turns out to be something that can be effectively accomplished. What one might call an "x-ray vision system" is proving to be an agreeable and cost effective way of reliably finding breaks in traces, bridges between traces, and voids in solder joints. Since x-rays are involved, these defects need not be upon an exposed surface to be discovered. The determination that a defect is present can be made by analysis of a suite of work images (say, for a solder joint) or by comparison of a work image with a stored exemplar (say, for trace integrity).

Such automated x-ray inspection systems have found acceptance in the marketplace, and new and refined techniques are appearing that both lower the cost and increase the capability of new automated inspection systems.

One of the ways to lower the cost of an x-ray imaging system is to reduce its mechanical complexity. One form for an early system used a circularly deflected x-ray beam and a rotating sensor. These items might be twelve to twenty inches away from each other, with the PCA disposed between them, but all must be in precision alignment if features (and defects) on the order of a few thousandths of an inch are to be resolved during testing. Such requirements add significantly to the mechanical complexity and cost of the imaging system.

An attractive alternative to such a design is one using a stationary TDI (Time Domain Integration) line scan camera (1), similar to the one described in the incorporated "PRECISE X-RAY INSPECTION SYSTEM . . . ", which we now summarize with the help of FIG. 1. As shown in FIG. 1, a plurality of multi-element imaging sensors (2) is disposed beneath a divergent x-ray 'point source' (3). Each image sensor is a TDI sensor that may be, for example, some number U, say U=18, of (closely spaced) pixels wide for each 'element,' while each image sensor has perhaps n=2048 of such U-many-pixel-wide elements closely and uniformly distributed along a length of say, six to eight and one half inches. Despite there being a total of (U·n)-many actual sensing devices within the entire TDI sensor, there are still just n-many outputs; one for each pixel position along the length. Each time the TDI sensor receives a clock pulse, a combined result influenced by the previous (in this case, twenty-four) clock cycles is presented as the output. We shall shortly have more to say about the TDI technique after a bit more of the line scan camera's architecture has been introduced, below.

Aside from their TDI properties, the image sensors may be similar to contact image sensors used in the low cost visual scanning of documents, save that they include a thin covering of material that fluoresces (or scintillates) with visible light when excited by x-rays. The long axes of the image sensors are all parallel to one another, and we shall call this direction the x axis. As might be expected, the direction in which the TDI image sensors have multiple pixels 'per element' is called the y axis. The arrangement in x and y of the individual TDI image sensors in their plurality is not a particular issue here, and we show them as spread out over an area, there better to mimic the spatial aspects of an 'area' image sensor. And while not essential, it is convenient if they cover a contiguous portion of the x axis with no embedded gaps corresponding to where one sensor stops and another starts.

Before proceeding we should address an issue relating to terminology and the use of the term 'camera' in this setting. We are aware that some practitioners use the term 'camera' to refer to an individual multi-element imaging sensor, whether it is but one pixel in width or is a TDI sensor, and that they would thus be inclined to refer to the overall line scan apparatus as the 'line scan system.' We find this somewhat cumbersome, as the term multi-element image sensor is perfectly descriptive, as is the notion of a camera whose output is an entire two or three dimensional image, and which happens to use a line scan technique upon multi-element TDI imaging sensors, and which we shall be content to call a 'line scan camera.'

To continue with FIG. 1, we shall arrange that the location from which the x-rays (4) emanate is above a central location within the arrangement of imaging sensors, and that the x-rays diverge uniformly in a generally conical manner toward the TDI imaging sensors. The imaging sensors are all mounted with uniform height at known locations within an x-y plane (5) that is perpendicular to the axis of the conical dispersion of the x-rays. We may assume, in the absence of any intervening material that absorbs or block x-rays, that each pixel location in the generally circular array of image sensors receives roughly the same level of x-ray illumination, and that each produces about the same level of electrical signal when clocked. (We also expect that any signal variations occurring under such 'neutral' conditions have been noted, and can if desired, be removed from measured data as effects of offsets and scaling, to leave in place indications related only to conditions within a PCA being tested.)

A PCA (6) to be tested is interposed between the x-ray source and the TDI imaging sensors, and is generally parallel to the x-y plane 5 of the imaging sensors. The size of the PCA may exceed that of the planar array of imaging sensors by many times over, and to accommodate that as well as allow each image sensor to 'see' every feature of interest on the PCA, the PCA is translated at a generally uniform velocity ($V_{scan}$) along a serpentine path 9 that is known in advance and under the control of a transport control mechanism (8), which may be a computer programmed and connected to operate in this manner. This is primarily smooth continuous motion back and forth along the y direction, with intervening discrete steps in the x direction at the extremes of y motion. During portions of the serpentine path when x-ray shadows of interest fall on the imaging sensors, the data signals from the TDI imaging sensors (denoted by the lower case Greek α) are read out at a regular clock rate and stored in a (rather large!) memory (7). Thus, at the end of a serpentine scan we have a whole big bundle of data that can be algorithmically manipulated (8) with software executed by a computer to produce (8) images of interest, and which may then be analyzed in isolation or compared to one or more exemplars, and in any case evaluated (10) using selected criteria. These techniques for analysis and comparison are conventional, and are not of further interest here.

Our interest lies more in an aspect of the manner in which an image is obtained in the first instance. To assist us in this, we may reduce the scope of the above described activity to obtaining a partial image along just one portion of one y-direction leg of the serpentine with data from just one imaging sensor. [This is done with the understanding, of course, that what we do for one imaging sensor we also do for the others, and that there are known ways for the processed data for the various sensors to be combined to produce a complete image of interest.]

To continue, we note that a notion of 'in focus' can be developed. Temporarily consider some pixel position along some imaging sensor that is not TDI, and is instead only one pixel wide. It basically represents all or a portion of an x-ray shadow of some target feature on the PCA that lies along the line (ray trace) from that pixel position to the origin of the x-rays (assumed to be a bright point-like spot). As the PCA moves, several values for our pixel location are clocked out and captured. These values are for different locations in y but at the same location (i) in x. Let's call such a thing a 'Y alpha sequence at (some) X,' or $Y\alpha@X_i$. At the same time this is also happening for other pixel locations on the same imaging sensor (at another value of i for $X_i$), and at the corresponding pixel location (if there is one at that x) on all the other imaging sensors. Typically, a complete camera system will have many imaging sensors and their arrangement is such that at least one other imaging sensor will eventually produce a sequence of signals (various α values) for that same target feature. ('Eventually' might mean at a different location on the same leg of the serpentine, or on a different leg.)

Now, for all the other imaging sensors that produced a sequence of signals for the target feature (which might well be all of them, or just the one), place the elements of these various $Y\alpha@X_i$ into correspondence: this element of the sequence from this sensor corresponds to that element of the sequence from another sensor, and so on. We note that these elements (various α values) were probably not obtained at the same time, as the feature might have been imaged at a different place along the serpentine path. The important thing is to agree that such a correspondence between 'the same location in x' on different imaging sensors exists, and the effects of sensor separation can be represented as shifts or offsets of element positions between the sequences: a shift (or offset) of so many elements between a $Y\alpha@X_1$ and a $Y\alpha@X_2$, and of a different number of elements between $Y\alpha@X_1$ and a $Y\alpha@X_3$, and so on.

A similar correspondence can be formed with shifts between different pixel locations in x that 'have the same y,' whether they are on the same imaging sensor or on two that each lie on the other's axial extension (along the x axis or along a line parallel to it). That is, the data also contains various instances of an 'X alpha sequence at (some) Y,' or, $X\alpha@Y_j$. (A note about notation is in order here. We will write $Y\alpha@X_i$ and $X\alpha@Y_j$ instead of $Y\alpha@X_i$ and $X\alpha@Y_i$, lest it appear that when considering these two at the same time the subscript i is a common value for each. When we write $Y\alpha@X_i$ and $X\alpha@Y_j$, each of i and j are allowed to range independently, and might be the same or might be different, as the case requires. What we mean is no more or no less than just 'some X' and 'some Y.')

Now, if we pick from some $Y\alpha@X_i$ and $X\alpha@Y_j$ that contain a common element that belongs to (is contained in) the target feature, and with knowledge of sensor separation and a desired height in z, we 'properly' shift their respective other $Y\alpha@X_i$ and $X\alpha@Y_j$ into correspondence with them and then combine (say, by averaging) all instances of that element (for the target feature) for all the sequences, we can favor the desired location along the z axis in that: For all the ray traces passing through the target feature at that z and reaching an image sensor, each has a signal value α related to the target feature, and we may take their average as representative thereof, while for other rays that might reach a sensor after passing through a different z location the associated signal values tend to cancel each other (average out). Note that: which pixel position along the length of a sensor has determined an x coordinate (as further understood by which leg in the serpentine the PCA was happening when that pixel value was taken); the location within the sequence of clocked out sensor values (which $\alpha_j$) within a leg determines the y coordinate; and, the desired z coordinate further affects the pattern of shifts or offsets between the $Y\alpha@X_i$ and $X\alpha@Y_j$ from for the imaging sensors. The averaged value obtained here is the value of the pixel at (x, y, z), i.e., its intensity, which we might call A (the Greek upper case alpha).

It will be appreciated that as the divergent x-rays spread out on their journey from the x-ray spot on the source, a given sized target object in the PCA will create a larger shadow (in spatial terms measured in pixel-to-pixel spacings at the imaging sensor) if the target object is closer to the x-ray spot on the source, than it does when further away. The ratio between the actual size of the target object and its apparent size according to the corresponding shadow on the sensor (and, of course, taking the spacing of the sensor elements into account) is called the magnification, or M. The value of M figures in how much to shift the sequence of measurable a values from each sensor to correspond to those of another sensor, or to shift a sequence of a values from a given sensor element for combination with the un-shifted sequence for the same sensor element, and thus 'focus' at a desired value of z.

Now, when we shift one collection of α values to combine it with another, one collection moves relative to the other: it won't do if they both move the same amount, as the net effect would be no shift at all. So, if there are several collections to be shifted by different amounts and then combined, we can appreciate that all of these can be thought of as being shifted by the requisite amounts relative to something that does not shift. That 'something' is the image, or slice, (which is some collections of α values) at some z height of convenience, say, $z_k$. We shall refer to this height $z_k$ in z as the reference plane. When considering what magnification M is afoot for the focusing of images, the necessary shifting will be performed relative to $z_k$, and the value of M that exists for using that particular value of z will be called $M_{ref}$.

We have just found (x, y, z, A), or a pixel description for a location in space, which might belong to a solder ball affixing a huge IC to a ball grid array. We do this for not just one pixel location, but for all pixel locations that may be of interest (there might be parts of a PCA that we do not bother to inspect). That is, we can pick an (x, y) location and then shift in x as y remains fixed, and then shift in y as x remains fixed. Then we pick another (x, y) location, and so on. What emerges is an (x, y) image in A at some height in z. We probably want the same (x, y) regions at other values for z, as well, and it will be appreciated that in this general manner a desired complete two or three dimensional image can be formed. The serpentine path serves to cover the entire PCA, while an increased plurality of imaging sensors provides improved cancellation of the 'out of focus' planes in z.

Now let's consider what happens if we use a TDI imaging sensor, instead of one just a single pixel in width. As before, each clock cycle produces $Y\alpha@X_i$ and $X\alpha@Y_j$ for our use. Unfortunately, the situation for the TDI $Y\alpha@X_i$ is more complicated than it was before, and than for the $X\alpha@Y_j$. The $Y\alpha@X_i$ are aligned with the direction of mechanical motion of the PCA along a leg of the serpentine. A phenomenon known as "TDI blur" acts as a fly in the ointment of both 2D and 3D imaging, and restricts the range of z values for which a given scan taken at, say, $z_1$, can be focused for slices above and below $z_1$ based on just that one scan at $z_1$. The resulting acceptable ROF (Range Of Focus) might be, say, $z_1+p\Delta z$ to $z_1-q\Delta z$, or perhaps just ±200 mils. An ROF many times that amount is customarily possible with non-TDI imaging sensors that are just one pixel wide. Despite this, TDI is valued for the superior images that it does produce within its ROF, and the usual cure when the PCA to be inspected is thicker than the camera's ROF is to equip a TDI line scan camera system with a transport mechanism that can change the height of the PCA below the x-ray source and above the imaging plane. Such a change in z height repositions the PCA so that the portion of interest will then fall within the ROF. It is not that this does not work, but z axis motion is an expensive mechanical capability to provide, and it can be a fussy thing to keep well maintained.

To conclude this somewhat simplified description of how a TDI line scan camera operates, we should dwell a bit more on this notion of TDI blur. Perhaps if we do, we can find a way to save the TDI ointment from the fixed-location-ROF fly, and do so without resorting to an expensive variable z height PCA transport mechanism.

Refer now to FIG. 2, which is a simplified mechanical schematic diagram 10 of a portion of the system of FIG. 1.

FIG. 2 illustrates the cause of TDI blur in the y direction and the observation that there is a plane of least blur for some height $z_1$ in the z direction. The TDI image sensor 2 is n-many pixels in width along a direction that is parallel to the direction of PCA motion, which is in the y direction. We denote these n-many y positions as $y_{j-n}$ to $y_{j-1}$. There is a 'position' $y_j$ that is not in the sensor 2 any more, and that is actually in memory (7) as the a value clocked out for the most recent cycle of the clock signal (that clock signal is not shown). In the x direction are some large number of pixel positions: $x_i$, $x_{i+1}$, $x_{i+2}$, . . . .

Thus, for each clock cycle the TDI sensor 2 produces an entire (new) XαYj and the next installment in (component of) that contributes to each of $Y\alpha X_i$, $Y\alpha N_{i+1}$, $Y\alpha X_{i+2}$, . . . . The individual α output values that make up these sequences are the actual outputs from the TDI sensor 2, and are represented by the arrows 13. These individual α output values are stored in a suitable data structure located in memory 7 and can be accessed to assemble the various sequences of interest for algorithmic purposes having to do with image formation and so forth.

The next step is to appreciate how the optical width (n-many pixels across) of the TDI sensor contributes to what is clocked out as the various $x_i$, $x_{i+1}$, $x_{i+2}$, . . . at $y_j$. Each time the TDI imaging sensor 2 receives a cycle of the clock signal an amount of charge in an optical sensing cell 20 (say the one at $(x_i, y_{j-n})$ in the figure) corresponding to the accumulated (integrated) amount of radiation incident thereon since the last clock cycle, is transferred (via an arrow 12) to the adjacent cell at the same x position but at the next y position [which in this example would be to the cell 21 at $(x_i, y_{j-(n-1)})$]. The idea is that the recipient cell gets a head start on forming a signal (more charging, or not) that corresponds to the thing being imaged, and noise gets averaged out. In order for this to work, we assume that the shadow of the thing being imaged also moves over by an amount 'physical Δy' that matches the 'optical Δy' (i.e., the pixel-to-pixel spacing within the sensor 2 along the y direction) so that continued charge accumulation (or not) will proceed as if for a long exposure with a non TDI line scan camera. So, the 'long exposure' is n-many pixels in duration, which in terms of time is however long it takes to move n-many physical Δys. The $n_{th}$ clock cycle will output from cell 22 to memory (7) the accumulated charge for the previous n-many exposures across the width of the TDI sensor, and do so for each of the various $x_i$ locations.

This manner of operation may be appreciated by considering the solid square ■ representing some feature's image (or a portion thereof) on a PCA 14. Solid square 17a lies along a BEFORE ray 18 of actinic radiation and its shadow 28 determines (at some time $t_0$) the charge on the cell 20. As the PCA moves by each Δy the shadow of 17a falls upon the next cell along the y axis, until after (n−1)-many shifts (at $t_{(n−1)}$ and after (n−1)-many Δys) the shadow 31 of 17b (PCA 14 having been shifted to the right in the figure, and now lying along the AFTER ray 19) falls on cell 22. At $t_n$ (n-many Δys) that last accumulated amount of signal (which is very different from just what shadow 31 by itself would produce on cell 22) will be output as the a value for $Y_j@X_i$. It will be appreciated that for each of the intervening shifts the shadow of the solid square fell upon the corresponding intervening cell, and that charge accumulation (or not) proceeded as if for a stationary 'long' exposure upon a single cell.

This happy circumstance (the α value for $Y_j@X_i$ is a very good signal!) does have one special requirement, however. What has been described in the two preceding paragraphs will occur only if, given a particular velocity $V_{scan}$ and optical $\Delta y$, the PCA has a particular height $z_1$ in the z direction that we shall call the POLB (Plane Of Least Blur). An appreciation of this allows us to answer the question: "Why is there such a thing as TDI blur, anyway?"

To see the answer to that question, it is only necessary to consider what happens when (for the same $V_{scan}$, physical $\Delta y$ and optical $\Delta y$) the PCA is at a different height, say, the situation at 15 for a lesser height of $z=z_1-q\Delta z$. From an inspection of the figure it can be appreciated that for (the same) PCA 15 at that lesser height the solid triangle ▲ 23a will for some clock cycle produce a shadow 27 along ray 18 on cell 20, which is fine as far it goes. However, after (n−1)-many shifts solid triangle 23b (now shifted to the right) projects along ray 24 to produce a shadow 32 that is not even upon the sensor 2. Oops! From further inspection of the figure it will also be appreciated for (the same PCA) at situation 16 with a greater height ($z=z_1+p\Delta z$) the solid splat ✱25a will for some clock cycle produce a shadow 29 along ray 18 on cell 20, which is well and good. However, after (n−1)-many shifts solid splat 25b (now shifted to the right) projects along ray 26 to produce a shadow 30 that is not upon cell 22 of the sensor 2, but upon cell 33 instead. Double Oops! The shadows projected along rays 24 and 26 do not fall on cell 22, and are instances of TDI blur, the degree of which is clearly a function of height in z.

Now, in all candor a little TDI blur is not fatal. We can express a tolerance for TDI blur as an allowable number of pixel positions for mis-registration of the sort produced by rays 24 and 26. In a TDI sensor that is twenty-four pixels wide a mis-registration of ±4 pixel positions (±4 optical $\Delta y$s) is perhaps a reasonable limit. For focusing or imaging operations that exceed that limit we might be justified in declaring that the various $Y\alpha X_i$, $Y\alpha X_{i+1}$, $Y\alpha X_{i+2}$, . . . are corrupted beyond redemption, and cannot be used. (As an aside, one might expect that the $X\alpha Y_j$ are not afflicted with or defiled by TDI blur. In terms of the explanation given for FIG. 2, at pixel 20 the contribution of shadows 27 and 29 to that of 28 cannot be separated from that for 28, and so on with irregular effect for pixels position further along y. What we can say is that the shadow 28 is reinforced, while the others are not . . . . ) To prevent exceeding the ±4 pixel positions we are compelled to impose a corresponding limit on how far away a desired z value can be from the actual value of $z_1$ that was in use during the scan that acquired the data. The lower limit of $z=z_1-q\Delta z$ and the upper limit of $z=z_1+p\Delta z$ are illustrative of establishing an ROF (although we confess that the particular $z_1-q\Delta z$ and $z_1+p\Delta z$ of this particular figure do not illustrate an ROF corresponding to ±4 pixel positions).

The situation then, is this. By accepting the notion of ROF we agree to tolerate a bit of degradation in images that are scanned at $z=z_1$ (that is, at the POLB) but eventually used to focus at a plane above or below that, but still within the ROF ($z_1-q\Delta z$ to $z_1+p\Delta z$) set by tolerating some TDI blur. In general, p won't equal q, and the ROF might be in the range of about ±200 mils. There are occasionally times when a PCA to be inspected will be thicker than that. The cure of providing a movable z axis to relocate the PCA relative to $z_1$ is pretty expensive if the need is only occasional. We need a genuine cure that doesn't make us regret having to provide it. Ah, but how to do it?

SIMPLIFIED DESCRIPTION

The need for a Time Domain Integration line scan camera to change a workpiece's height in z to match an ROF (Range Of Focus) of fixed excursions about a fixed POLB (Plane Of Least Blur) is removed by making the location of the POLB movable, thus making the location of the associated ROF variable, while leaving the actual z height of the workpiece unchanged. This can be accomplished by ensuring that, for a desired new location of the POLB, the rate at which the physical $\Delta y$s transpire for the motion of the workpiece (which may be a PCA) matches the rate at which the optical $\Delta y$s are clocked for the TDI image sensor. That may be achieved by varying the value for physical $\Delta y$ as function of the POLB's location in z regardless of $V_{scan}$, but while also adjusting $V_{scan}$ if that is necessary or desirable to keep such things as sensor cell exposure levels, and contrast from moving away from their optimum values.

DETAILED DESCRIPTION

Figure 3:
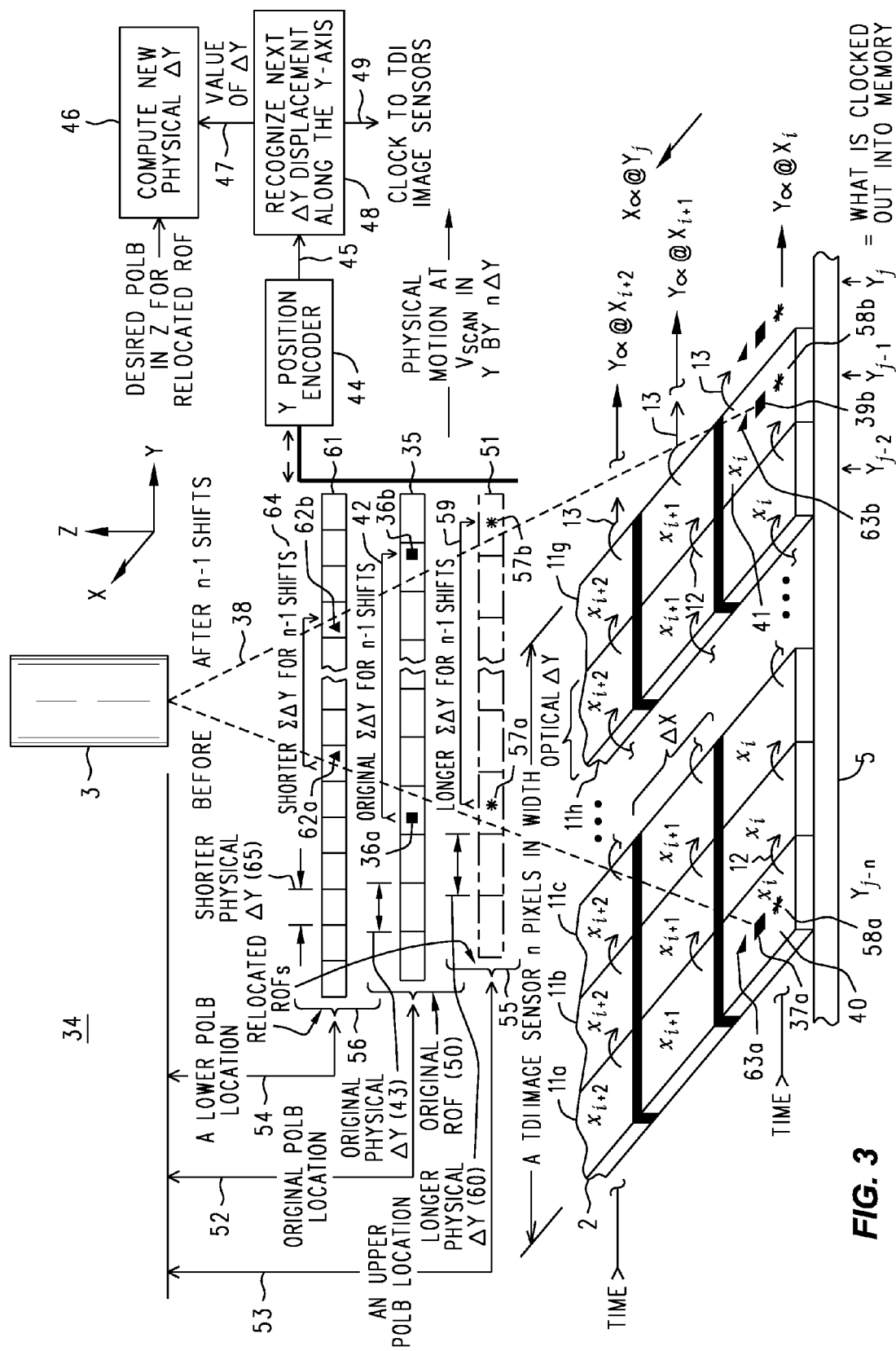
FIG. 3 is a simplified diagram similar to FIG. 2, and illustrates that the location of a Range Of Focus can be altered in the z direction without there being any change in the actual z position of the PCA being inspected by varying the value for physical $\Delta y$ as function of the ROF's location in z regardless of $V_{scan}$.

We turn now to FIG. 3, which is a simplified mechanical schematic/electrical block diagram 34 that illustrates how a Range Of Focus for a TDI line scan camera can be relocated from one height along the z direction to another height, obviating the need for a for workpiece transport mechanism that provides actual variable physical positioning of the workpiece along the z axis.

Figure 1:
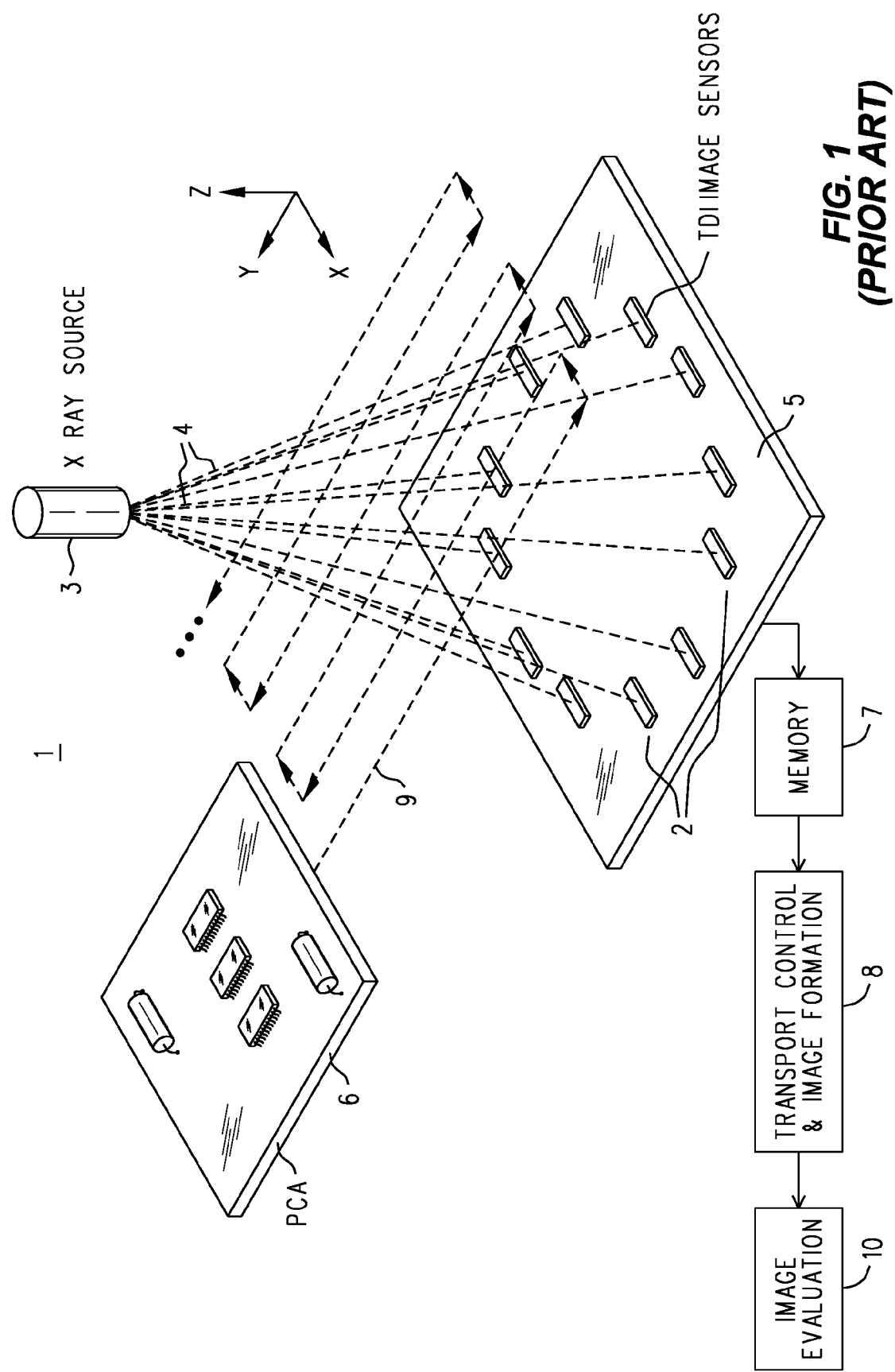
FIG. 1 is a simplified perspective view of certain overall aspects of an x-ray TDI line scan camera system for the automated inspection of PCAs.
Figure 2:
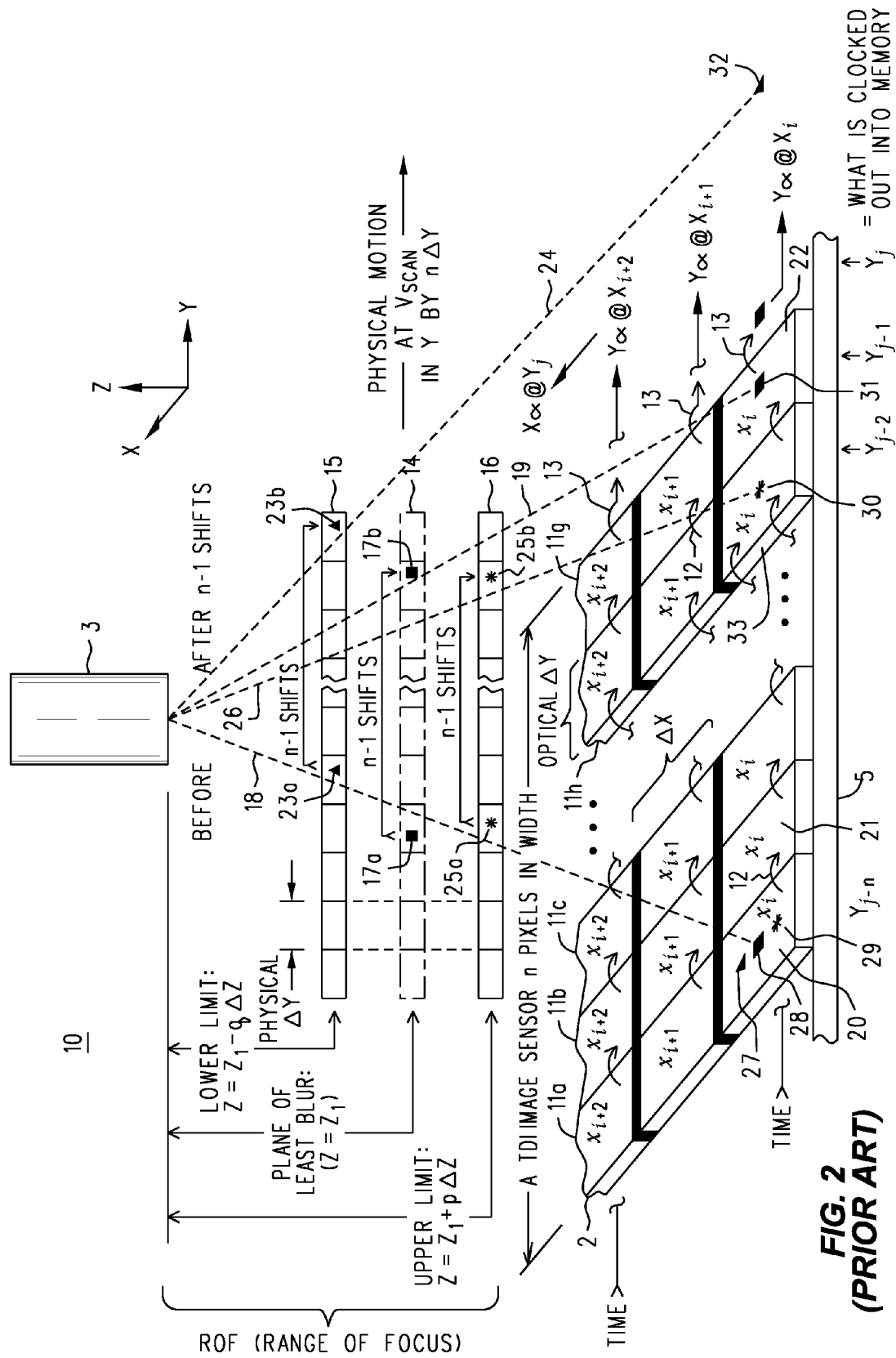
FIG. 2 is a simplified mechanical schematic diagram of a portion of the system of FIG. 1 and illustrates the notion of TDI blur in the y direction and that there is a plane of least blur for some height $z_1$ in the z direction.

To begin, consider a PCA (or other workpiece) to be imaged or inspected is situated at location 35, in that it is disposed at a z height 52 that is an original POLB [Plane Of Least (TDI) Blur]. Because it is at a POLB the shadow 39a of solid square 36a lies along a BEFORE ray 37 and falls upon cell 40. After (n−1)-many shifts in an original $\Delta y$ (43) the shadow 39b of the now shifted (by 42) solid square ■ 36b lies along AFTER ray 38 and falls on cell 41. We note that cell 41 is (n−1)-many optical $\Delta y$s after cell 40 and conclude that this is indeed a situation (ala 14 in FIG. 2) of no TDI blur. We note also from a remembrance of FIG. 2 that situation 35 will have an accompanying ROF 50. We also note that if all this is to be so, then the vertical scale relating situations 16, 14 and 15 of FIG. 2 is not quite the same as for 51, 35 and 61 of FIG. 3, although the structural relationships depicted remain accurate in the abstract. For convenience, we may assume that situation 35 in FIG. 3 corresponds to situation 14 of FIG. 2.

Now let's consider the case where we desire to relocate the ROF 55 to the location (53) associated with situation 51. We are confident that as the workpiece is shifted solid splat ✱57a will align closely with BEFORE ray 37 and that the shadow 58a will eventually fall on (or within ±½ $\Delta y$, which is close enough . . . ) cell 40. (We have such confidence because we have adjusted the value for physical $\Delta y$—read on.) To get rid of TDI blur and make situation 51 be an upper POLB location (53) we need to ensure that after (n−1)-many shifts for Δy the shadow 58b falls on cell 41 (or within ±½Δy of there). We do that by making physical Δy longer (60) for situation 51/upper POLB location 53. We make it the right amount longer so that (n−1)-many shifts of the longer physical Δy (60) match, through the magnification that attaches to situation 51, the cell to cell shifts of optical Δy (11a-g). That way, shadow 58b does indeed end up on (or very close to, and well within TDI blur limits) cell 41. That is to say, the physical distance 59 for those (n−1)-many shifts of physical Δy is the right amount longer than was the distance 42 for situation 35. Thus, once again, there is no TDI blur of significance, and we are allowed (according to the teachings of FIG. 2) a relocated ROF 55 about this new POLB 53. We note that it is a matter of need, or perhaps of convenience, whether or not relocated ROF 55 overlaps, just touches, or is disjoint from original ROF 50, as that will be just a matter of properly selecting the new longer value (60) of physical Δy.

In the same way we can also relocate an ROF 56 to a lower POLB location 54 by instituting a shorter Δy (65) for situation 61. The same analysis will lead the reader to note the shorter total ΣΔy (64) that allows solid triangle ▲ 62a to have a shadow 63 a on cell 40, while after the (n−1)-many shifts (ΣΔy) the shadow 63b of the shifted 62b falls on cell 41 (or very close to it). Once again the result is no significant TDI blur, and access to a relocated ROF 56, all without changing the height in z of the workpiece. As before, we note that it is a matter of need, or perhaps of convenience, whether or not relocated ROF 56 overlaps, just touches, or is disjoint from original ROF 50 (or, ROF 55, or any other ROF!), as that will be just a matter of properly selecting the new shorter value (65) of physical Δy. Either of relocated ROFs 55 and 56 can be at arbitrary locations along the z direction, consistent with our ability to mange new values for physical Δy, while also not upsetting any other aspect of the camera's operation.

So, how do we get new values for physical Δy? First, we decide what they should be. This is essentially an exercise in trigonometry involving similar triangles reflecting the different magnification that would occur if the workpiece were at a height different than the one at which it will actually be scanned (which almost certainly $z_1$ of FIG. 2). Though those similar triangles are not explicitly shown in FIG. 3, they are there implicitly, in that all of their edges and locations are items already in the figure, and it would clutter that already busy figure considerably to include them . . . . The following relationship can be used in place of a similar triangles diagram:

Physical Δy=($Z_{POLB}$)(Optical Δy)/$Z_{camera}$ where Zcamera is the vertical distance between the point source of illumination and the imaging plane containing the imaging sensors Once we know what a desired different physical Δy (47) ought to be [say, we computed it (46) as a function of a desired POLB (location in z) for a relocated ROF] we can supply that to a circuit or as a variable in a computational process (48) that also receives from a y position encoder coupled to the workpiece an encoded y value 45. Each time the encoded y value 45 changes by the Δy amount (47) a clock signal 49 is issued to the TDI sensors 2. Hence, we have coupled the taking of samples at optical Δy to the motion of some selected physical Δy in such a manner that they stay in step over the entire width (11a-11g) of the TDI sensor 2. That is, we have relocated the ROF, and have done so without requiring a change in the actual height of the workpiece in the z direction.

It will be appreciated that each time the ROF is relocated a new scan will be required (assuming the image sought is not within an earlier ROF). We note that this would be the case even in there were a movable z axis mechanism.

With regard to the velocity $V_{scan}$ mentioned earlier and by which the workpiece/PCA is moved, we expect that it will be a generally 'constant' velocity (stepper motors might well be used in causing its motion, but by the time a drive train transmits that impetus to the workpiece the motion is unlikely to be one of discrete starts and stops, although that is, in principle, possible and would not, in principle, hurt anything). $V_{scan}$ is of interest for the following reason. Let's say we selected a new physical Δy that is twice some "nominal" value. Radiation from the source 3 would fall upon cells in the TDI imaging sensors for twice the amount of time if $V_{scan}$ were left unchanged. This might, for example, overexpose the image by driving some cells into saturation. In the other case, where a selected new physical Δy is, say, half its "nominal" value, then some cells could receive too little radiation and the image appear underexposed. Since it may not be desirable to compensate for this by adjusting the intensity of the x-ray source (regulation and certification issues might arise) we can instead alter $V_{scan}$ to keep such issues as exposure levels within an acceptable range.

It will be further appreciated with respect to the foregoing, that the relocation of ROF can be performed for a line scan camera with just one TDI imaging sensor, provided that it is either long enough so that a single scan will cover the entire object to be imaged, or if not, a suitable serpentine or other scan pattern is employed. Furthermore, the placement of the TDI imaging sensors (2) within the imaging plane (5) may be arbitrary (i.e., random, or at least irregular), or regular. 'Regular' means in accordance with some regular or symmetrical geometrical figure, such as equally spaced locations around the perimeter or circumference of a circular or elliptical shape, or at the vertices of a regular polygon.

It will also be appreciated that the techniques described herein can be applied for workpieces that are transparent to visible light, where the source of illumination includes visible light, and where the imaging sensors are responsive to visual light.

I claim:

1. A method of selecting the location of the range of focus $z_0-q\Delta z$ to $z_0+p\Delta z$ in a line scan camera having time domain integration imaging sensors, the method comprising the steps of:
    (a) selecting as the height of a plane of least blur a height $z_0$ along a z axis that is generally normal to an x-y plane in which is disposed at least one time domain integration imaging sensor whose length in pixel locations is parallel to x, whose direction of time domain integration is a width in pixel locations parallel to y and whose time domain integration is performed in response to cycles in a shift clock signal;
    (b) continuously moving a workpiece interposed between the x-y plane and a source of actinic radiation centered on the z axis and illuminating the at least one time domain integration imaging sensor in the x-y plane, the motion of the workpiece being in a plane parallel to the x-y plane and in a direction parallel to y;
    (c) selecting a value physical Δy, such that for a ray leaving the source of actinic radiation and passing through some imaged location of the workpiece and intersecting a first pixel cell within the at least one time domain integration imaging sensor, when the workpiece is displaced by step (b) in the amount of physical $\Delta y$ another ray passing through the same imaged location intersects a second pixel cell within the at least one time domain integration imaging sensor and adjacent to the first pixel cell in the y direction;

(d) detecting the y position of the workpiece;

(e) issuing the shift clock signal each time the y position detected in step (d) changes by the value of physical $\Delta y$ selected in step (c); and (f) storing in a memory a collection of x direction output values shifted out from the time domain integration sensor each time the shift clock signal is issued by step (e).

2. A method as in claim 1 wherein the actinic radiation of step (b) diverges from its source and illuminates a plurality of time domain integration imaging sensors.

3. A method as in claim 1 further comprising the step of (g) of forming an image by processing collections of x direction output values stored in step (f) by shifting those collections in x and y by amounts of pixel positions corresponding to a height along the z axis different from $z_0$ but within the range of focus $z_0-q\Delta z$ to $z_0+p\Delta z$.

4. A method as in claim 1 further comprising the steps (g) of, subsequent to steps (a)-(f), selecting a different value of $z_0$ while leaving the z height of the workpiece unchanged, and then (h) of repeating steps (b)-(f).

5. A method as in claim 1 wherein the workpiece comprises a printed circuit assembly and the actinic radiation comprises x-rays.

6. A method as in claim 1 wherein the workpiece is transparent to light of at least some visual wavelengths and the actinic radiation comprises visible light.

7. A method as in claim 1 further comprising the step (g) of selecting a velocity $V_{scan}$ for use in step (b) such that a cumulative amount of illumination available to fall on a cell of the at least one time domain integration sensor, during the time required to displace the workpiece by the physical $\Delta y$ selected in step (c), remains within selected limits.

8. A method as in claim 1 wherein the at least one time domain integration imaging sensor comprises a generally circular arrangement of a plurality of time domain imaging sensors disposed upon the x-y plane at known locations relative to each other.

9. A method as in claim 1 wherein the at least one time domain integration imaging sensor comprises a regular arrangement of a plurality of time domain imaging sensors disposed upon the detection plane at known locations relative to each other, and wherein the regular arrangement comprises the vertices of a regular geometric figure.

10. A method as in claim 1 wherein the at least one time domain integration imaging sensor comprises an arbitrary arrangement of a plurality of time domain integration imaging sensors disposed upon the detection plane at known locations relative to each other.

11. A method as in claim 1 wherein step (b) comprises motion in a serpentine pattern having legs parallel to the y direction and that are each a step apart in the x direction.

12. A method of selecting the location of the range of focus $z-q\Delta z$ to $z_0+p\Delta z$ in a line scan camera having time domain integration imaging sensors, the method comprising the steps of:

(a) selecting as the height of a plane of least blur a height $z_0$ along a z axis that is generally normal to an x-y plane in which is disposed at least one time domain integration imaging sensor whose length in pixel locations is parallel to x, whose direction of time domain integration is a width in pixel locations parallel to y and whose time domain integration is performed in response to cycles in a shift clock signal;

(b) continuously moving a workpiece interposed between the x-y plane and a source of actinic radiation centered on the z axis and illuminating the at least one time domain integration imaging sensor in the x-y plane, the motion of the workpiece being in a plane parallel to the x-y plane and in a direction parallel to y;

(c) selecting a value physical $\Delta y$, such that for a ray leaving the source of actinic radiation and passing through some imaged location of the workpiece and intersecting a first pixel cell within the at least one time domain integration imaging sensor, when the workpiece is displaced by step (b) in the amount of physical $\Delta y$ another ray passing through the same imaged location intersects a second pixel cell within the at least one time domain integration imaging sensor and adjacent to the first pixel cell in the y direction;

(d) detecting the expiration of a time interval $\Delta t$ corresponding to the physical $\Delta y$ selected in step (c);

(e) issuing the shift clock signal each time an expiration of $\Delta t$ is detected by step (d); and (f) storing in a memory a collection of x direction output values shifted out from the time domain integration sensor each time the shift clock signal is issued by step (e).

13. A method as in claim 12 wherein the actinic radiation of step (b) diverges from its source and illuminates a plurality of time domain integration imaging sensors.

14. A method as in claim 12 further comprising the step of (g) of forming an image by processing collections of x direction output values stored in step (f) by shifting those collections in x and y by amounts of pixel positions corresponding to a height along the z axis different from $z_0$ but within the range of focus $z_0-q\Delta z$ to $z_0+p\Delta z$.

15. A method as in claim 12 further comprising the steps (g) of, subsequent to steps (a)-(f), selecting a different value of $z_0$ while leaving the z height of the workpiece unchanged, and then (h) of repeating steps (b)-(f).

16. A method as in claim 12 wherein the workpiece comprises a printed circuit assembly and the actinic radiation comprises x-rays.

17. A method as in claim 12 wherein the workpiece is transparent to light of at least some visual wavelengths and the actinic radiation comprises visible light.

18. A method as in claim 12 further comprising the step (g) of selecting a velocity $V_{scan}$ for use in step (b) such that a cumulative amount of illumination available to fall on a cell of the at least one time domain integration sensor, during the time required to displace the workpiece by the physical $\Delta y$ selected in step (c), remains within selected limits.

19. A method as in claim 12 wherein the at least one time domain integration imaging sensor comprises a generally circular arrangement of a plurality of time domain imaging sensors disposed upon the x-y plane at known locations relative to each other.

20. A method as in claim 12 wherein the at least one time domain integration imaging sensor comprises a regular arrangement of a plurality of time domain imaging sensors disposed upon the detection plane at known locations relative to each other, and wherein the regular arrangement comprises the vertices of a regular geometric figure.

21. A method as in claim 12 wherein the at least one time domain integration imaging sensor comprises an arbitrary arrangement of a plurality of time domain integration imaging sensors disposed upon the detection plane at known locations relative to each other.

22. A method as in claim 12 wherein step (b) comprises motion in a serpentine pattern having legs parallel to the y direction and that are each a step apart in the x direction.

* * * * *

UNITED STATES PATENT AND TRADEMARK OFFICE
CERTIFICATE OF CORRECTION

PATENT NO. : 7,384,193 B2
APPLICATION NO. : 11/553534
DATED : June 10, 2008
INVENTOR(S) : Eliasson Page 1 of 1

It is certified that error appears in the above-identified patent and that said Letters Patent is hereby corrected as shown below:

In column 11, line 57, in Claim 12, delete "z–" and insert -- $z_o$– --, therefor.

Signed and Sealed this

Second Day of September, 2008

JON W. DUDAS
*Director of the United States Patent and Trademark Office*